(12) United States Patent
Yim et al.

(10) Patent No.: US 11,710,673 B2
(45) Date of Patent: Jul. 25, 2023

(54) INTERPOSER AND SEMICONDUCTOR PACKAGE INCLUDING THE SAME

(71) Applicant: Samsung Electronics Co., Ltd., Suwon-si (KR)

(72) Inventors: Choongbin Yim, Seoul (KR); Dongwook Kim, Asan-si (KR); Hyunki Kim, Asan-si (KR); Jongbo Shim, Asan-si (KR); Jihwang Kim, Cheonan-si (KR); Sungkyu Park, Seoul (KR); Yongkwan Lee, Hwaseong-si (KR); Byoungwook Jang, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 74 days.

(21) Appl. No.: 17/376,883

(22) Filed: Jul. 15, 2021

(65) Prior Publication Data

US 2022/0189835 A1 Jun. 16, 2022

(30) Foreign Application Priority Data

Dec. 15, 2020 (KR) .......................... 10-2020-0175839

(51) Int. Cl.
*H01L 23/12* (2006.01)
*H01L 23/538* (2006.01)

(52) U.S. Cl.
CPC .......... *H01L 23/12* (2013.01); *H01L 23/5384* (2013.01); *H01L 23/5385* (2013.01); *H01L 23/5386* (2013.01)

(58) Field of Classification Search
CPC . H01L 23/12; H01L 23/5384; H01L 23/5385; H01L 23/5386
See application file for complete search history.

(56) References Cited

U.S. PATENT DOCUMENTS

| | | |
|---|---|---|
| 7,160,757 B2 | 1/2007 | Narkhede et al. |
| 8,928,132 B2 | 1/2015 | Choi et al. |
| 9,117,808 B2 | 8/2015 | Toh et al. |
| 9,480,158 B2 | 10/2016 | Lee et al. |
| 10,121,722 B1 | 11/2018 | Jha et al. |

(Continued)

FOREIGN PATENT DOCUMENTS

| | | |
|---|---|---|
| KR | 10-1817159 B1 | 2/2018 |
| KR | 10-1963273 B1 | 3/2019 |

*Primary Examiner* — Fernando L Toledo
*Assistant Examiner* — Neil R Prasad
(74) *Attorney, Agent, or Firm* — Harness, Dickey & Pierce, P.L.C.

(57) ABSTRACT

A semiconductor package including a first package substrate, a first semiconductor chip on the first package substrate, a first conductive connector on the first package substrate and laterally spaced apart from the first semiconductor chip, an interposer substrate on the first semiconductor chip and electrically connected to the first package substrate through the first conductive connector, the interposer substrate including a first portion overlapping the first semiconductor chip and a plurality of upper conductive pads in the first portion, a plurality of spacers on a lower surface of the first portion of the interposer substrate and positioned so as not to overlap the plurality of upper conductive pads in a plan view, and an insulating filler between the interposer substrate and the first package substrate may be provided.

20 Claims, 11 Drawing Sheets

(56) References Cited

U.S. PATENT DOCUMENTS

| | | |
|---|---|---|
| 2012/0083073 A1 | 4/2012 | Tanuma et al. |
| 2015/0249061 A1 | 9/2015 | Zhao et al. |
| 2016/0172292 A1 | 6/2016 | Hsu et al. |
| 2017/0098633 A1* | 4/2017 | Kumar ................ H01L 23/3114 |
| 2019/0214288 A1* | 7/2019 | Fan ..................... H01L 21/4853 |
| 2020/0328183 A1* | 10/2020 | Chen ................... H01L 23/5386 |

* cited by examiner

INTERPOSER AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2020-0175839, filed on Dec. 15, 2020, in the Korean Intellectual Property Office, the disclosure of which is incorporated by reference herein in its entirety.

BACKGROUND

The present disclosure relates to interposers and/or semiconductor packages including the same.

With the rapid development of the electronics industry and in order to meet the needs of users, electronic devices are becoming more compact, multifunctional, and have large capacity, and accordingly, a semiconductor package including a plurality of semiconductor chips is required. Therefore, the semiconductor package using an interposer to connect highly integrated semiconductor chips having an increased number of connection terminals for input/output (I/O) has been developed.

SUMMARY

Some example embodiments of the inventive concepts provide interposers and/or semiconductor packages including the same.

According to some example embodiments of the inventive concepts, a semiconductor package may include a first package substrate, a first semiconductor chip on the first package substrate, a first conductive connector on the first package substrate and laterally separated from the first semiconductor chip, an interposer substrate on the first semiconductor chip and electrically connected to the first package substrate through the first conductive connector, the interposer substrate including a first portion overlapping the first semiconductor chip and a plurality of upper conductive pads in the first portion, a plurality of spacers on a lower surface of the first portion of the interposer substrate that faces the first semiconductor chip and positioned so as not to overlap the plurality of upper conductive pads in a plan view, an insulating filler between the interposer substrate and the first package substrate, and in contact with the first conductive connector and the first semiconductor chip, a plurality of second conductive connectors on the plurality of upper conductive pads, a second package substrate on the plurality of second conductive connectors, and a second semiconductor chip on the second package substrate.

According to some example embodiments of the inventive concepts, a semiconductor package may include a package substrate, a semiconductor chip on the package substrate, a first conductive connector on the package substrate and laterally spaced apart from the semiconductor chip, an interposer substrate on the semiconductor chip, the interposer substrate including a first portion overlapping the semiconductor chip in a first direction perpendicular to an upper surface of the package substrate and a second portion that is in the neighborhood of the first portion and connected to the first conductive connector, and a plurality of upper conductive pads at an upper surface of the first portion, and a plurality of spacers between a lower surface of the first portion of the interposer substrate and the semiconductor chip, the plurality of spacers positioned so as not to overlap the plurality of upper conductive pads in a plan view.

According to some example embodiments of the inventive concepts, an interposer for a semiconductor package may include a base insulating layer, a plurality of upper conductive pads on an upper surface of the base insulating layer, an upper protective insulating layer covering the upper surface of the base insulating layer and including openings exposing the plurality of upper conductive pads, a plurality of lower conductive pads on a lower surface of the base insulating layer, a lower protective insulating layer covering the lower surface of the base insulating layer and including openings exposing the plurality of lower conductive pads, and a plurality of spacers on the lower protective insulating layer and positioned so as not to overlap the plurality of upper conductive pads in a plan view. The plurality of upper conductive pads include four upper conductive pads arranged in a rectangular shape on the upper surface of the base insulating layer, and at least one of the plurality of spacers is between the four upper conductive pads in a plan view.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
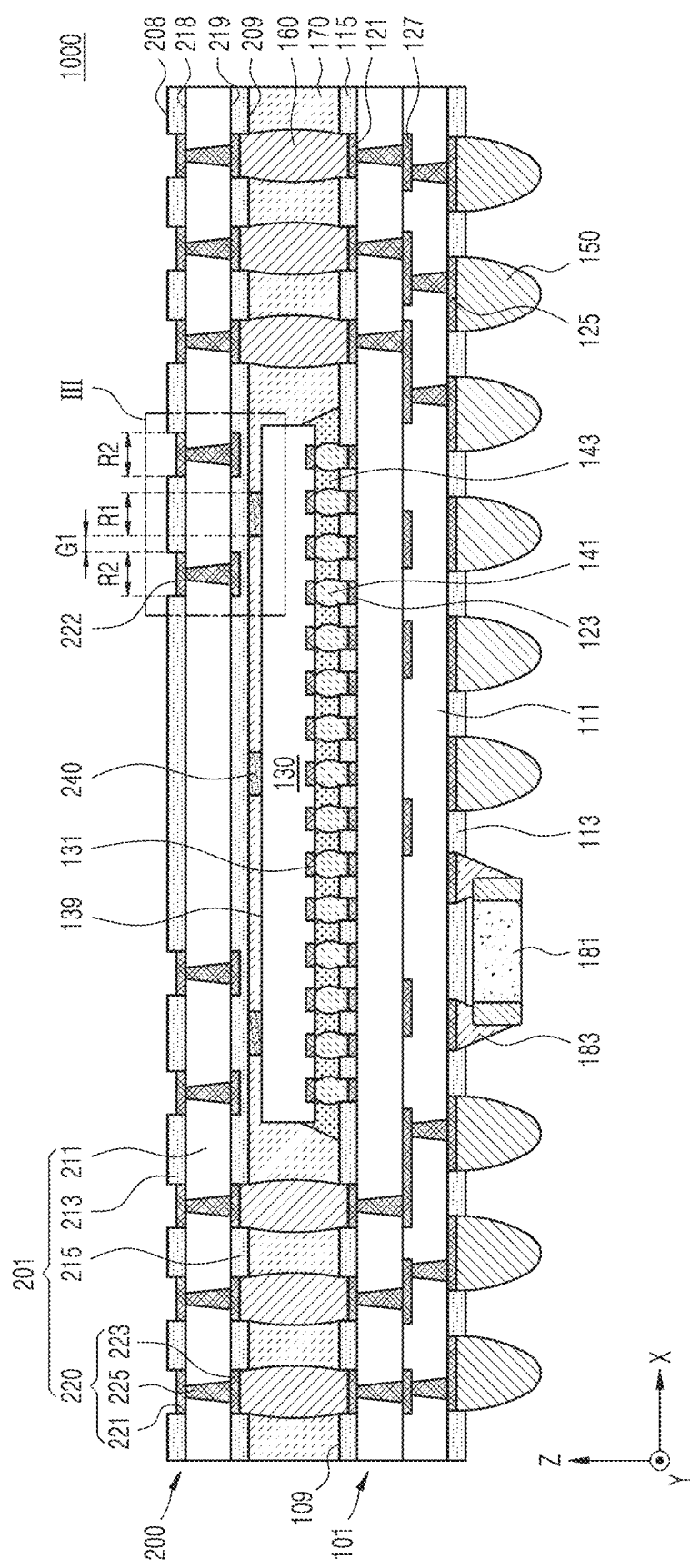
FIG. 1 is a cross-sectional view illustrating a semiconductor package according to some example embodiments of the inventive concepts.

Hereinafter, some example embodiments of the technical idea of the inventive concepts will be described in detail with reference to the accompanying drawings. The same reference numerals are used for the same components in the drawings, and redundant descriptions thereof are omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
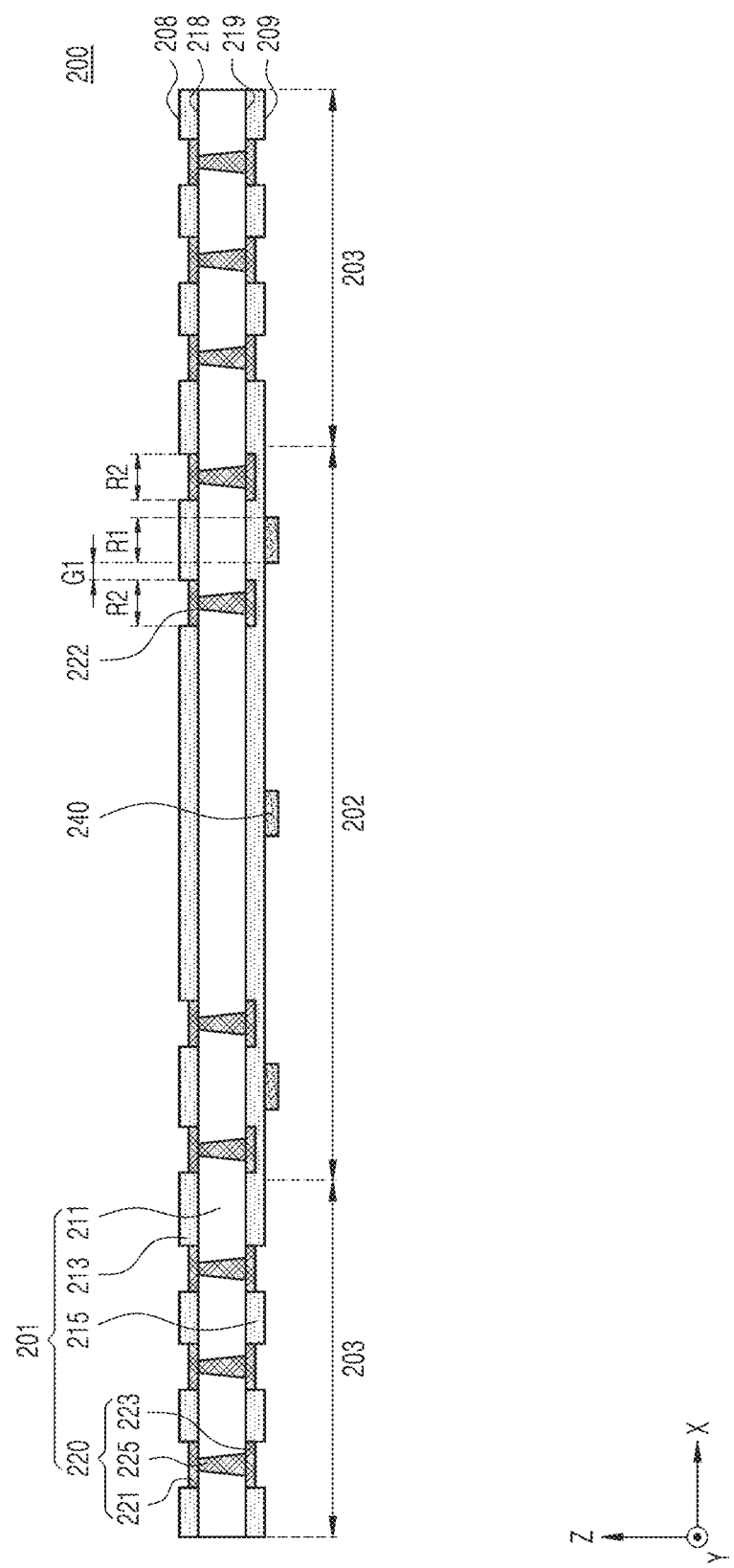
FIG. 2 is a cross-sectional view illustrating an interposer of FIG. 1.

FIG. 1 is a cross-sectional view illustrating a semiconductor package 1000 according to some example embodiments of the inventive concepts. FIG. 2 is a cross-sectional view illustrating an interposer 200 of FIG. 1.

Referring to FIGS. 1 and 2, the semiconductor package 1000 may include a first package substrate 101, a first semiconductor chip 130, a first conductive connector 160, an insulating filler 170, and the interposer 200.

The first package substrate 101 may be, for example, a printed circuit board (PCB). The first package substrate 101 may include a substrate base 111 including at least one material selected from phenol resin, epoxy resin, and polyimide. Further, the first package substrate 101 may include a first upper substrate pad 121 and a second upper substrate pad 123 provided on an upper surface of the substrate base 111, and a lower substrate pad 125 provided on a lower surface of the substrate base 111. An internal wiring pattern 127 that is configured to electrically connect the first upper substrate pad 121 and the second upper substrate pad 123 to the lower substrate pad 125 may be formed in the substrate base 111. The internal wiring pattern 127 may include a line pattern extending in a horizontal direction (X direction or Y direction) in the first package substrate 101 and a via pattern extending in a vertical direction (Z direction) in the first package substrate 101.

The first package substrate 101 may include a substrate upper protective layer 115 on the upper surface of the substrate base 111 and a substrate lower protective layer 113 on the lower surface of the substrate base 111. The substrate upper protective layer 115 and the substrate lower protective layer 113 may be formed of, for example, a solder resist.

For example, the first upper substrate pad 121, the second upper substrate pad 123, and the lower substrate pad 125 may include metals such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or alloys thereof.

The first upper substrate pad 121 may be a pad to which the first conductive connector 160 is attached, and the second upper substrate pad 123 may be a pad to which a chip connection bump 141 such as a micro bump is attached. The first conductive connector 160 may be connected to the first upper substrate pad 121 through a first opening provided in the substrate upper protective layer 115, and the chip connection bump 141 may be connected to the second upper substrate pad 123 through a second opening provided in the substrate upper protective layer 115.

The lower substrate pad 125 may function as a pad to which an external connection terminal 150 is attached. The external connection terminal 150 may be connected to the lower substrate pad 125 through an opening provided in the substrate lower protective layer 113. The external connection terminal 150 may be, for example, a solder ball. The external connection terminal 150 may electrically and physically connect the semiconductor package 1000 to an external device.

In the example embodiments, at least one passive device 181 may be attached to the lower surface of the first package substrate 101. The at least one passive device 181 may be a surface-mount device (SMD). For example, the at least one passive device 181 may be a capacitor or a resistor. A terminal portion of the at least one passive device 181 may be electrically connected to the lower substrate pad 125 through a connection terminal 183 provided on the lower substrate pad 125. In some example embodiments, at least one passive device 181 may be embedded in the first package substrate 101.

The first semiconductor chip 130 may be mounted on the first package substrate 101. The first semiconductor chip 130 may be between the first package substrate 101 and the interposer 200 in the vertical direction (Z direction) perpendicular to an upper surface 109 of the first package substrate 101.

The first semiconductor chip 130 may include a semiconductor substrate having an active surface and an inactive surface opposite to each other. The semiconductor substrate may include silicon, for example, crystalline silicon, polycrystalline silicon, or amorphous silicon. The first semiconductor chip 130 may include a semiconductor element layer formed on the active surface of the semiconductor substrate. The first semiconductor chip 130 may include a lower surface and an upper surface 139 opposite to each other, and a chip pad 131 may be provided on the lower surface of the first semiconductor chip 130. The lower surface of the first semiconductor chip 130 may be a surface adjacent to the active surface of the semiconductor substrate, and the upper surface 139 of the first semiconductor chip 130 may be a surface adjacent to the inactive surface of the semiconductor substrate. The chip pad 131 of the first semiconductor chip 130 may be electrically connected to the semiconductor element layer through a wiring structure provided inside the first semiconductor chip 130.

In the example embodiments, the first semiconductor chip 130 is a memory chip and may include a volatile memory chip and/or a nonvolatile memory chip. The volatile memory chip may include, for example, dynamic random access memory (DRAM), static RAM (SRAM), thyristor RAM (TRAM), zero capacitor RAM (ZRAM), or twin transistor RAM (TTRAM). The nonvolatile memory chip may include, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or insulator resistance change memory.

In the example embodiments, the first semiconductor chip 130 may be a non-memory chip. For example, the first semiconductor chip 130 may be a logic chip and may include an artificial intelligence semiconductor, a microprocessor, a graphics processor, a signal processor, a network processor, a chipset, an audio codec, a video codec, or an application processor.

The first semiconductor chip 130 may be mounted on the first package substrate 101 in a face-down method or a flip chip method. That is, the first semiconductor chip 130 may be mounted on the first package substrate 101 such that the lower surface of the first semiconductor chip 130, on which the chip pad 131 is provided, faces the first package substrate 101. The chip pad 131 of the first semiconductor chip 130 may be electrically connected to the second upper substrate pad 123 through the chip connection bump 141. The chip pad 131 of the first semiconductor chip 130 may be used as a terminal for transmitting input/output data signals of the first semiconductor chip 130 or a terminal for power and/or grounding of the first semiconductor chip 130.

A portion between the first semiconductor chip 130 and the first package substrate 101 may be filled with an underfill material layer 143 surrounding the chip connection bump 141. For example, the underfill material layer 143 may be made of epoxy resin formed by a capillary under-fill method. In some example embodiments, the underfill material layer 143 may be a non-conductive film. However, in some example embodiments, a gap between the first semiconductor chip 130 and the first package substrate 101 may be directly filled with an insulating filler 170 by a molded underfill method. In this case, the underfill material layer 143 may be omitted.

The interposer 200 may be provided on the first package substrate 101 and the first semiconductor chip 130. The interposer 200 may include an interposer substrate 201. The interposer substrate 201 may have a flat plate shape, and may include an upper surface 208 and a lower surface 209 opposite to each other. The interposer substrate 201 may include a base insulating layer 211, an upper protective insulating layer 213, a lower protective insulating layer 215, and a wiring structure 220.

The base insulating layer 211 may include at least one material selected from phenol resin, epoxy resin, and polyimide. For example, the base insulating layer 211 may include at least one material selected from polyimide, Flame Retardant 4 (FR-4), tetrafunctional epoxy, polyphenylene ether, epoxy/polyphenylene oxide, bismaleimide triazine (BT), thermount, cyanate ester, and liquid crystal polymer. In other example embodiments, the interposer substrate 201 may include silicon (Si), for example, crystalline silicon, polycrystalline silicon, or amorphous silicon.

The wiring structure 220 may include upper conductive pads 221 on the upper surface 218 of the base insulating layer 211, lower conductive pads 223 on the lower surface 219 of the base insulating layer 211, and conductive vias 225 penetrating through the base insulating layer 211. The upper conductive pads 221 may include pads to which connectors such as solder balls are attached. The lower conductive pads 223 may include pads to which the first conductive connector 160 for electrically connecting the first package substrate 101 to the interposer 200 is attached. The conductive vias 225 may be in contact with the upper conductive pads 221 and the lower conductive pads 223, respectively, and may be configured to electrically connect the upper conductive pads 221 to the lower conductive pads 223.

The wiring structure 220 may include, for example, metals such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or an alloy thereof.

The upper protective insulating layer 213 may be arranged on the upper surface 218 of the base insulating layer 211, and the lower protective insulating layer 215 may be arranged on the lower surface 219 of the base insulating layer 211. The upper protective insulating layer 213 may cover the upper surface 218 of the base insulating layer 211, and may include upper openings for exposing the upper conductive pads 221. The lower protective insulating layer 215 may cover the lower surface 219 of the base insulating layer 211, and may include lower openings for exposing the lower conductive pads 223.

For example, the upper protective insulating layer 213 and the lower protective insulating layer 215 may be formed of a solder resist.

The interposer substrate 201 may have a planar area greater than that of the first semiconductor chip 130. The interposer substrate 201 may include a first portion 202 that is a portion overlapping the first semiconductor chip 130 and a second portion 203 around the first portion 202. In the vertical direction (Z direction) perpendicular to the upper surface 109 of the first package substrate 101, the first portion 202 of the interposer substrate 201 may overlap the first semiconductor chip 130 in a plan view. The planar area of the first portion 202 of the interposer substrate 201 may be the same as that of the first semiconductor chip 130. The first portion 202 of the interposer substrate 201 may include a center portion of the interposer substrate 201. The second portion 203 of the interposer substrate 201 surrounds the first portion 202 of the interposer substrate 201 in a plan view, and may include an outer portion of the interposer substrate 201.

The first conductive connector 160 may electrically connect the interposer substrate 201 to the first package substrate 101. The first conductive connector 160 may be laterally spaced apart from a sidewall of the first semiconductor chip 130 in the horizontal direction (X direction and/or Y direction), and may have a pillar shape extending between the first package substrate 101 and the second portions 203 of the interposer substrate 201. The lower portion of the first conductive connector 160 may be in contact with the first upper substrate pad 121 of the first package substrate 101, and the upper portion of the first conductive connector 160 may be in contact with the lower conductive pad 223 located in the second portion 203 of the interposer substrate 201. The first conductive connector 160 may include, for example, a conductive material such as solder or copper (Cu).

The insulating filler 170 may be provided on the first package substrate 101. The insulating filler 170 may be filled between the first package substrate 101 and the interposer 200. The insulating filler 170 may protect the first package substrate 101, the first semiconductor chip 130, the first conductive connector 160, and the interposer 200 from an external environment. The insulating filler 170 may cover at least a part of each of the first package substrate 101, the first semiconductor chip 130, the first conductive connector 160, and the interposer 200. For example, the insulating filler 170 may cover the upper surface 109 of the first package substrate 101, the sidewall and the upper surface 139 of the first semiconductor chip 130, the sidewall of the first conductive connector 160, and the lower surface 209 of the interposer substrate 201. Further, a gap between the lower surface 209 of the first portion 202 of the interposer 200 and the upper surface 139 of the first semiconductor chip 130 may be filled with the insulating filler 170.

In the example embodiments, in order to form the insulating filler 170, a supply process of supplying an insulating filler material constituting the insulating filler 170 between the first package substrate 101 and the interposer 200, and a curing process of curing the insulating filler material may be performed.

In the example embodiments, the insulating filler 170 may include epoxy-group molding resin, polyimide-group molding resin, or the like. For example, the insulating filler 170 may include an epoxy molding compound (EMC).

The interposer 200 may include a plurality of spacers 240 arranged on the lower surface 209 of the first portion 202 of the interposer substrate 201. The plurality of spacers 240 may have a pillar shape protruding from the lower surface 209 of the first portion 202 of the interposer substrate 201 toward the upper surface 139 of the first semiconductor chip 130.

In the example embodiments, each of the plurality of spacers 240 may have a circle shape, a polygonal shape such as a triangle, a rectangle, a rhombus, a line shape, or a cross shape in a plan view.

The plurality of spacers 240 may separate the lower surface 209 of the interposer substrate 201 from the upper surface 139 of the first semiconductor chip 130. A gap between the lower surface 209 of the interposer substrate 201 and the upper surface 139 of the first semiconductor chip 130 may have a distance that is same or substantially similar to a height of each of the plurality of spacers 240.

While the insulating filler 170 is formed, the plurality of spacers 240 may support the interposer substrate 201 so that the lower surface 209 of the interposer substrate 201 may be spaced apart from the first semiconductor chip 130. A gap through which the insulating filling material may flow may be provided between the lower surface 209 of the interposer substrate 201 and the upper surface 139 of the first semiconductor chip 130 by the plurality of spacers 240. Therefore, a problem of incompletely filling of the portion between the lower surface 209 of the interposer substrate 201 and the upper surface 139 of the first semiconductor chip 130 with the insulating filler 170, and a problem of void generation due to such incomplete filling may be mitigated or prevented.

In the example embodiments, a height of each of the plurality of spacers 240 protruding from the lower surface 209 of the interposer substrate 201 may be between about 20 micrometers (μm) and about 40 μm. If the height of the plurality of spacers 240 is less than 20 μm, the gap between the lower surface 209 of the interposer substrate 201 and the upper surface 139 of the first semiconductor chip 130 is too small, and thus, it is difficult to sufficiently flow the insulating filling material between the interposer substrate 201 and the first semiconductor chip 130. If the height of the plurality of spacers 240 is greater than 40 μm, a total thickness of the semiconductor package 1000 is increased, and thus it is difficult to miniaturize the semiconductor package 1000.

The plurality of spacers 240 may be arranged in the form of a two-dimensional array on the lower surface 209 of the first portion 202 of the interposer substrate 201. A lower surface of each of the plurality of spacers 240 may be in contact with the upper surface 139 of the first semiconductor chip 130, and a sidewall of each of the plurality of spacers 240 may be covered by the insulating filler 170.

In the example embodiments, the plurality of spacers 240 may be formed of the same material as that of the lower protective insulating layer 215. For example, the plurality of spacers 240 may include a solder resist. For example, in order to form the plurality of spacers 240, a solder resist material layer covering the lower surface 219 of the base insulating layer 211 may be formed, and a patterning process may be performed on the solder resist material layer to form the lower protective insulating layer 215 and the plurality of spacers 240 together.

In the example embodiments, the plurality of spacers 240 may be formed of a material different from that of the lower protective insulating layer 215. For example, the lower protective insulating layer 215 may include a solder resist, and the plurality of spacers 240 may include epoxy resin or polyimide resin. For example, in order to form the plurality of spacers 240, dot-shaped structures may be attached on the lower protective insulating layer 215.

Some of the upper conductive pads 221 of the interposer substrate 201 may be provided in the first portion 202 of the interposer substrate 201. Hereinafter, among the upper conductive pads 221, a pad located in the first portion 202 of the interposer substrate 201 will be referred to as a first upper conductive pad 222. In this case, the plurality of spacers 240 may be positioned so as not to overlap the plurality of first upper conductive pads 222 in a plan view. That is, each of the plurality of spacers 240 does not overlap any one of the plurality of first upper conductive pads 222 in the vertical direction (Z direction).

Regions overlapping the plurality of spacers 240 in the vertical direction (Z direction) on the upper surface 208 of the first portion 202 of the interposer substrate 201 may be defined as spacer overlapping regions R1, and regions overlapping the plurality of first upper conductive pads 222 in the vertical direction (Z direction) on the upper surface 208 of the first portion 202 of the interposer substrate 201 may be defined as pad overlapping regions R2. In this case, the spacer overlapping regions R1 may not overlap the pad overlapping regions R2. For example, in the vicinity of an edge of the first portion 202 of the interposer substrate 201, a distance G1 between the spacer overlapping region R1 and the pad overlapping region R2 adjacent to each other may be about 10 μm to about 100 μm.

Figure 3:
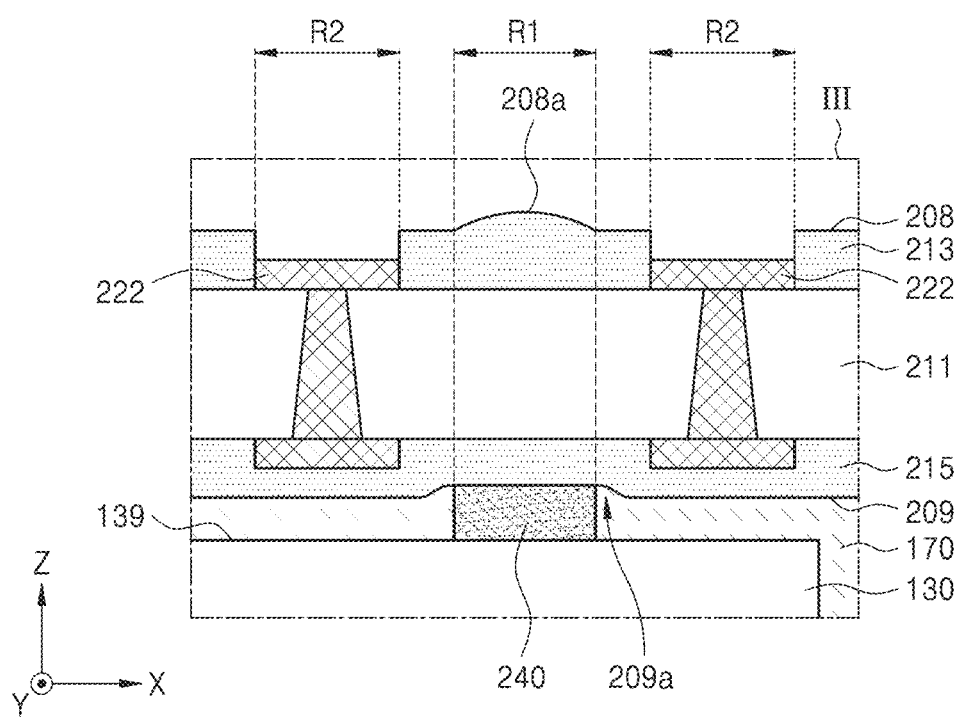
FIG. 3 is an enlarged view illustrating an area indicated by "III" in FIG. 1.

FIG. 3 is an enlarged view illustrating an enlarged area indicated by "III" in FIG. 1.

Referring to FIGS. 1 to 3, the interposer 200 may be mounted on the first package substrate 101 by a thermocompression bonding process. In this case, the upper surface 208 of the interposer substrate 201 may have a convex surface portion 208a in the spacer overlapping region R1 which overlaps the spacer 240 in the vertical direction (Z direction). That is, a part of the upper surface 208 of the interposer substrate 201 overlapping the spacer 240 in the vertical direction (Z direction) may have the convex surface portion 208a upwardly protruding from a periphery thereof (e.g., at a peripheral portion of the first portion 202). For example, the convex surface portion 208a is a part of the upper surface of the upper protective insulating layer 213, and the upper surface of the upper protective insulating layer 213 may have the convex surface portion 208a in the spacer overlapping region R1.

The lower surface 209 of the interposer substrate 201 may have a recessed surface portion 209a near a portion which is in contact with the spacer 240. That is, a part of the lower surface 209 of the interposer substrate 201, which is in contact with the spacer 240, may be recessed from the periphery thereof (e.g., at a peripheral portion of the first portion 202) to form a recessed surface portion 209a.

If some of the plurality of first upper conductive pads 222 are positioned to overlap the spacer overlapping regions R1, the first upper conductive pads 222 overlapping the spacer overlapping regions R1 may be deformed during the thermocompression bonding process. Deformation of the first upper conductive pad 222 deteriorates reliability of the connection between the first upper conductive pad 222 and the second conductive connector (see 390 in FIG. 8), and reliability of electrical connection between the semiconductor device mounted on the interposer substrate 201 by using the second conductive connector 390 and the interposer substrate 201 may be deteriorated.

However, according to the example embodiments of the inventive concepts, a gap is provided between the interposer substrate 201 and the first semiconductor chip 130 by using the plurality of spacers 240 to solve the issue of incomplete filling of the insulating filler 170. Further, the plurality of first upper conductive pads 222 of the interposer substrate 201 are positioned so as not to overlap the plurality of spacers 240 in the vertical direction (Z direction) and thus reliability of the connection between the first upper conductive pad 222 and the second conductive connectors 390 may be mitigated or prevented from being deteriorated.

Figure 4:
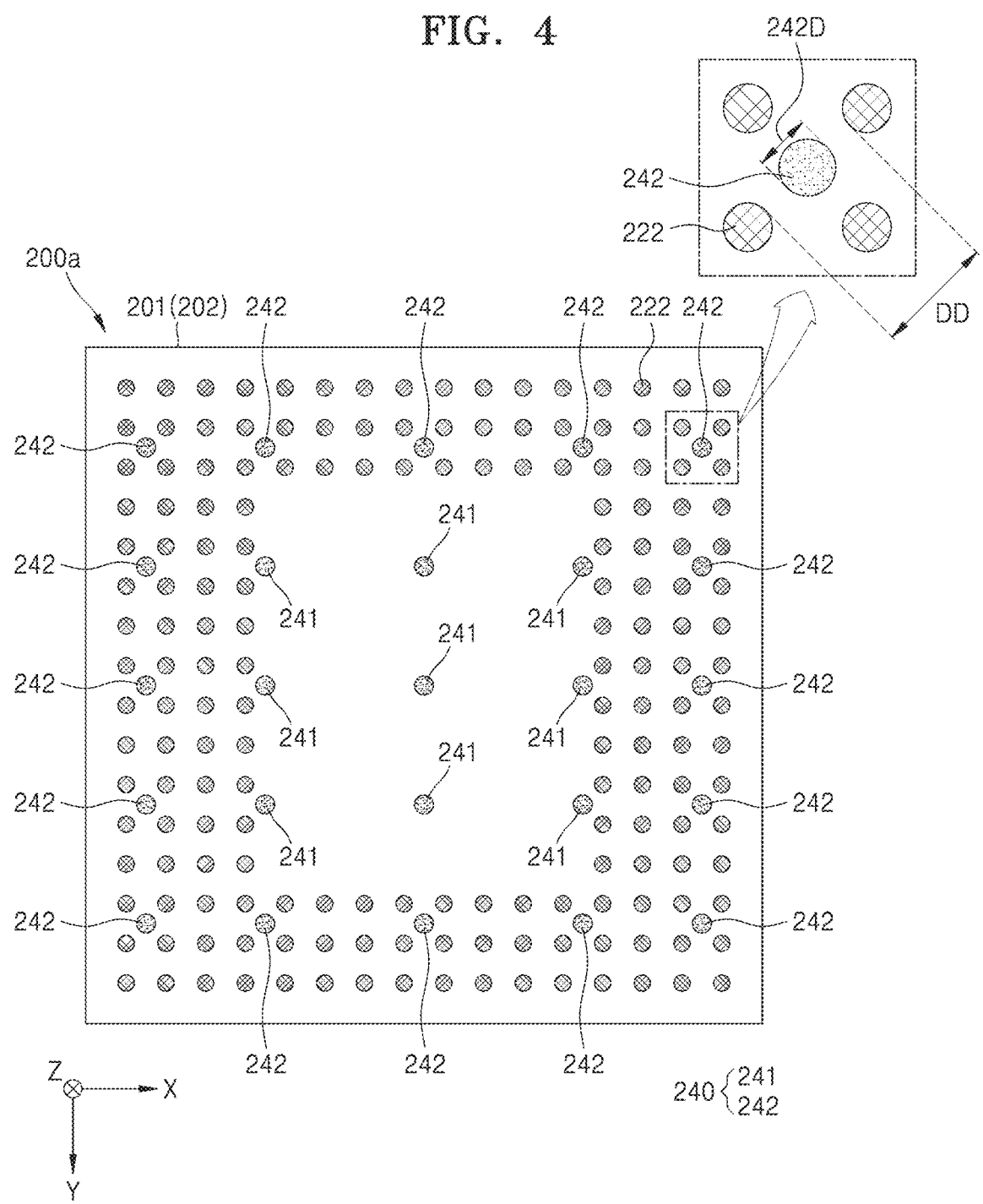
FIG. 4 is a layout diagram illustrating an arrangement of a plurality of first upper conductive pads and an arrangement of a plurality of spacers in an interposer according to some example embodiments of the inventive concepts.

FIG. 4 is a layout diagram illustrating an arrangement of the plurality of first upper conductive pads 222 and an arrangement of the plurality of spacers 240 in an interposer 200a according to some example embodiments of the inventive concepts. In FIG. 4, the first portion 202 of the interposer substrate 201 is illustrated, and the illustration of the second portion (see 203 in FIG. 2) of the interposer substrate 201 is omitted.

Referring to FIG. 4 together with FIGS. 1 and 2, the plurality of first upper conductive pads 222 may be arranged in a first horizontal direction (X direction) parallel to the upper surface 109 of the first package substrate 101 and/or, in a second horizontal direction (Y direction) parallel to the upper surface 109 of the first package substrate 101 and perpendicular to the first horizontal direction (X direction). For example, the plurality of first upper conductive pads 222 may be arranged in the first horizontal direction (X direction) and/or the second horizontal direction (Y direction) on the upper surface 218 of the base insulating layer 211. In this case, the plurality of spacers 240 are arranged on the lower surface 209 of the first portion 202 of the interposer substrate 201, and may be positioned so as not to overlap the plurality of first upper conductive pads 222 in a plan view.

In the example embodiments, the plurality of first upper conductive pads 222 are not arranged in the center portion of the first portion 202 of the interposer substrate 201, but may be arranged in the outer portion of the first portion 202 of the interposer substrate 201. In other example embodiments, the plurality of first upper conductive pads 222 may be substantially and evenly distributed entirely over the first portion 202 of the interposer substrate 201.

The plurality of spacers 240 may be arranged on both the center portion and the outer portion of the first portion 202 of the interposer substrate 201. The plurality of spacers 240 may include at least one central spacer 241 arranged in the center portion (or in a central portion) of the lower surface 209 of the first portion 202 of the interposer substrate 201, and an edge spacer 242 arranged in the outer portion (with respect to the center portion) of the lower surface 209 of the first portion 202 of the interposer substrate 201.

In the example embodiments, the interposer substrate 201 may include at least one central spacer 241 arranged in the center portion of the lower surface 209 of the first portion 202 of the interposer substrate 201, and a plurality of edge spacers 242 arranged in the outer portion of the lower surface 209 of the first portion 202 of the interposer substrate 201. For example, when dividing the lower surface 209 of the first portion 202 of the interposer substrate 201 into four regions by any two straight lines passing through a center of the lower surface 209 of the first portion 202 of the interposer substrate 201 and intersecting perpendicularly to each other, at least one edge spacer 242 may be arranged in each of the four regions. In the example embodiments, the plurality of edge spacers 242 may be arranged symmetrically with respect to the center of the lower surface 209 of the first portion 202 of the interposer substrate 201.

In the example embodiments, a distance between the centers of the first upper conductive pads 222 adjacent to each other may be defined as a first pitch, and a distance between the centers of the edge spacers 242 adjacent to each other may be defined as a second pitch. In this case, the second pitch of the edge spacers 242 may be between about 2 times to about 30 times the first pitch of the first upper conductive pads 222.

In the example embodiments, the interposer 200a may include at least five spacers 240. For example, the interposer 200a may include one central spacer 241 positioned in the center of the lower surface 209 of the first portion 202 of the interposer substrate 201, and four edge spacers 242 arranged symmetrically with respect to the center of the lower surface 209 of the first portion 202 of the interposer substrate 201.

In the example embodiments, at least one of the plurality of spacers 240 may be arranged in a middle of the four first upper conductive pads 222 arranged in a rectangular shape in a plan view. In other words, at least one of the plurality of spacers 240 may be arranged on a point where a straight line connecting the centers of two first upper conductive pads 222 adjacent to each other in a first diagonal direction intersect with a straight line connecting the centers of two first upper conductive pads 222 adjacent to each other in a second diagonal direction. Here, the first diagonal direction may be a direction inclined in each of the first horizontal direction (X direction) and the second horizontal direction (Y direction), and the second diagonal direction may be a direction perpendicular to the first diagonal direction.

In a case where at least one of the plurality of spacers 240 is arranged in a middle of the four first upper conductive pads 222 arranged in a rectangular shape in a plan view, the upper surface 208 of the interposer substrate 201 between the four first upper conductive pads 222 arranged in the rectangular shape may have a convex surface portion (see 208a of FIG. 3).

For example, as illustrated in FIG. 4, the edge spacers 242 may be arranged in the middle of the four first upper conductive pads 222 arranged in the rectangular shape in a plan view. If the plurality of first upper conductive pads 222 are also arranged in the center portion of the lower surface 209 of the first portion 202 of the interposer substrate 201, the center spacer 241 may also be positioned in the middle of the four first upper conductive pads 222 arranged in the rectangular shape in a plan view.

In the example embodiments, a diameter 242D of the edge spacer 242 may be less than a distance DD between the two first upper conductive pads 222 adjacent to each other in the diagonal direction. For example, the diameter 242D of the edge spacer 242 may be between about 30% and about 90% of the distance DD between the two first upper conductive pads 222 adjacent to each other in the diagonal direction. In the example embodiments, a planar area of the edge spacer 242 may be between about 7% and about 70% compared to the area of the rectangle to which the centers of the four first upper conductive pads 222 arranged in the rectangular shape are connected. For example, the diameter 242D of the edge spacer 242 may be between about 80 μm and about 250 μm.

Figure 5:
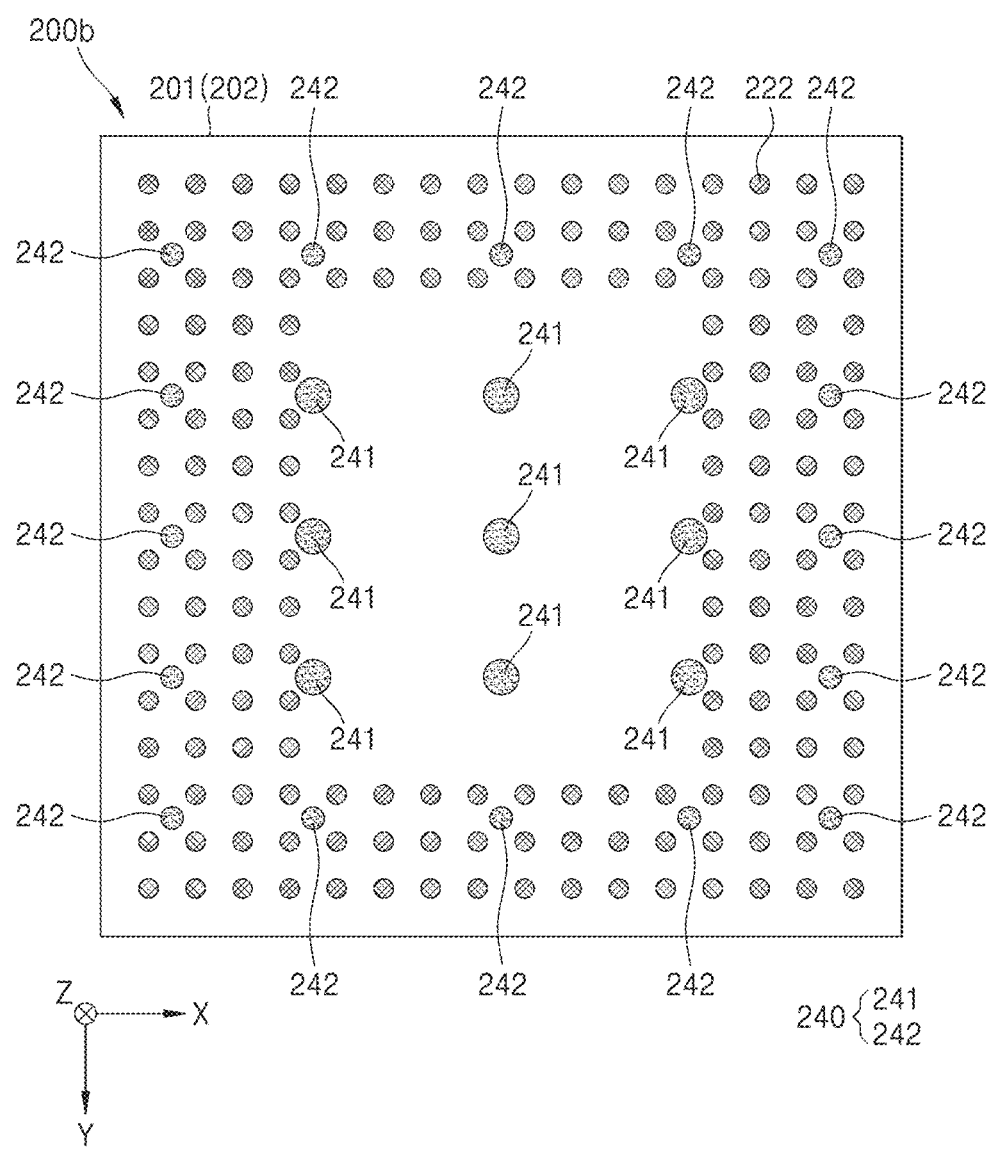
FIG. 5 is a layout diagram illustrating an arrangement of a plurality of first upper conductive pads and an arrangement of a plurality of spacers in an interposer according to some example embodiments of the inventive concepts.

FIG. 5 is a layout diagram illustrating an arrangement of the plurality of first upper conductive pads 222 and an arrangement of the plurality of spacers 240 in an interposer 200b according to some example embodiments of the inventive concepts. In FIG. 5, the first portion 202 of the interposer substrate 201 is illustrated, and the illustration of the second portion (see 203 in FIG. 2) of the interposer substrate 201 is omitted.

The interposer 200b illustrated in FIG. 5 may be the same as or substantially similar to the interposer 200a described with reference to FIG. 4 except that the center spacer 241 and the edge spacer 242 have different diameters from each other. Hereinafter, a description will be made focusing on differences from the interposer 200a described with reference to FIG. 4.

Referring to FIG. 5 together with FIGS. 1 and 2, the center spacer 241 may be arranged in the center portion of the lower surface 209 of the first portion 202 of the interposer substrate 201 on which the plurality of first upper conductive pads 222 are not arranged, and the edge spacer 242 may be arranged in the outer portion of the lower surface 209 of the first portion 202 of the interposer substrate 201 on which the plurality of first upper conductive pads 222 are arranged.

In this case, because the center spacer 241 is arranged in the central portion of the lower surface 209 of the first portion 202 of the interposer substrate 201 on which the plurality of first upper conductive pads 222 are not arranged, the diameter of the center spacer 241 may be greater than the diameter (242D in FIG. 4) of the edge spacer 242. For example, if the diameter 242D of the edge spacer 242 is less than the distance (DD in FIG. 4) between the first upper conductive pads 222 adjacent to each other in the diagonal direction, the diameter of the center spacer 241 may be greater than the distance DD between the first upper conductive pads 222 adjacent to each other in the diagonal direction.

Figure 6:
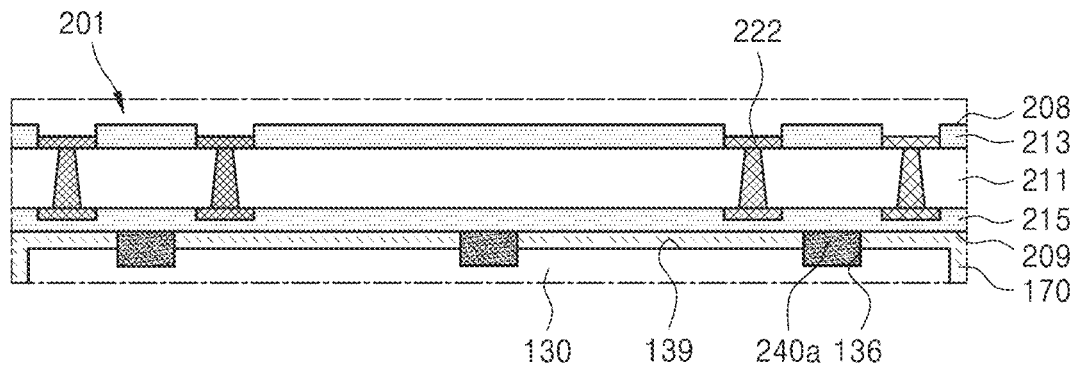
FIG. 6 is a cross-sectional view illustrating a part of a semiconductor package according to some example embodiments of the inventive concepts.

FIG. 6 is a cross-sectional view illustrating a part of the semiconductor package according to some example embodiments of the inventive concepts. For convenience of description, the semiconductor package illustrated in FIG. 6 will be described focusing on differences from the semiconductor package 1000 described with reference to FIGS. 1 and 2.

Referring to FIG. 6, the first semiconductor chip 130 may include a groove 136 configured to accommodate a spacer 240a of the interposer 200. The groove 136 of the first semiconductor chip 130 may be provided in the upper surface 139 of the first semiconductor chip 130. The groove 136 of the first semiconductor chip 130 is positioned to correspond to the spacer 240a of the interposer and may have a shape suitable for inserting the spacer 240a of the interposer so that a part of the spacer 240a of the interposer may be inserted.

As the spacer 240a of the interposer is inserted into the groove 136 of the first semiconductor chip 130, the interposer may be firmly fixed to the first semiconductor chip 130. Further, because the interposer may be aligned with the first semiconductor chip 130 by inserting the spacer 240a of the interposer into the groove 136 of the first semiconductor chip 130, misalignment between the interposer and the first semiconductor chip 130 may be mitigated or prevented.

Figure 7:
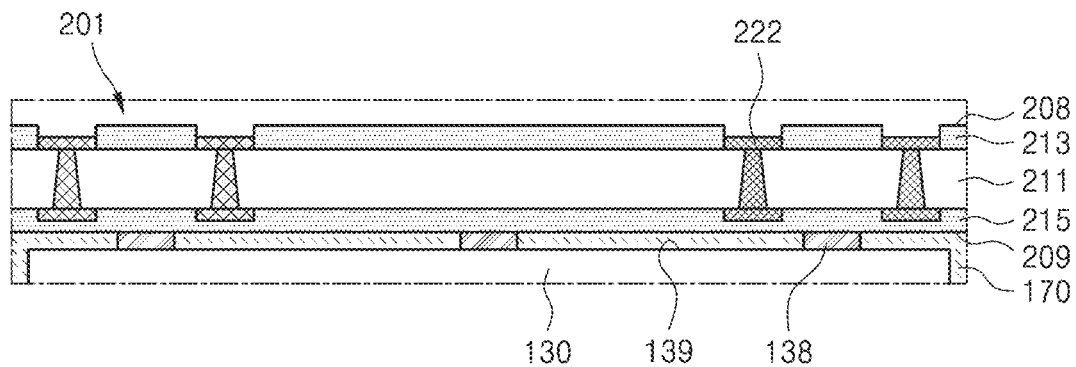
FIG. 7 is a cross-sectional view illustrating a part of a semiconductor package according to some example embodiments of the inventive concepts.

FIG. 7 is a cross-sectional view illustrating a part of the semiconductor package according to some example embodiments of the inventive concepts.

The semiconductor package illustrated in FIG. 7 may be the same as or substantially similar to the semiconductor package 1000 described with reference to FIGS. 1 and 2 except that the interposer does not include a plurality of spacers, and the first semiconductor chip 130 further includes a plurality of chip spacers 138. For convenience of description, the semiconductor package illustrated in FIG. 7 will be described focusing on differences from the semiconductor package 1000 described with reference to FIGS. 1 and 2.

Referring to FIG. 7, the first semiconductor chip 130 may include a plurality of chip spacers 138 arranged on the upper surface 139 of the first semiconductor chip 130. The plurality of chip spacers 138 may have a pillar shape protruding toward the lower surface 209 of the interposer substrate 201. In the example embodiments, the plurality of chip spacers 138 may be arranged on the upper surface 139 of the first semiconductor chip 130. The upper surface of each of the plurality of chip spacers 138 may be in contact the lower surface 209 of the interposer substrate 201, and a sidewall of each of the plurality of chip spacers 138 may be covered by the insulating filler 170.

In the example embodiments, the plurality of chip spacers 138 may include the same material as that of the semiconductor substrate of the first semiconductor chip 130. For example, the plurality of chip spacers 138 may include silicon.

In the example embodiments, the plurality of chip spacers 138 may be formed of a material different from that of the semiconductor substrate of the first semiconductor chip 130. For example, the plurality of chip spacers 138 may include epoxy-based resin or polyimide-based resin.

Similar to the plurality of spacers 240 of the interposer substrate 201 described with reference to FIGS. 1 and 2, the plurality of chip spacers 138 may separate the lower surface 209 of the interposer substrate 201 and the upper surface 139 of the first semiconductor chip 130. Further, the plurality of chip spacers 138 may be positioned so as not to overlap the plurality of first upper conductive pads 222 in a plan view.

In some example embodiments, when the first semiconductor chip 130 includes the chip spacer 138, the interposer (200 in FIG. 1) may further include at least one spacer (240 in FIG. 1) similar to that described with reference to FIGS. 1 and 2. In this case, the chip spacer 138 of the first semiconductor chip 130 and the spacer 240 of the interposer 200 may be spaced apart from each other. Further, each of the chip spacers 138 of the first semiconductor chip 130 and the spacers 240 of the interposer 200 may be positioned so as not to overlap the plurality of first upper conductive pads 222 in a plan view. In this case, the chip spacer 138 may separate the lower surface 209 of the interposer substrate 201 and the upper surface 139 of the first semiconductor chip 130 together with the spacer 240 of the interposer 200.

Figure 8:
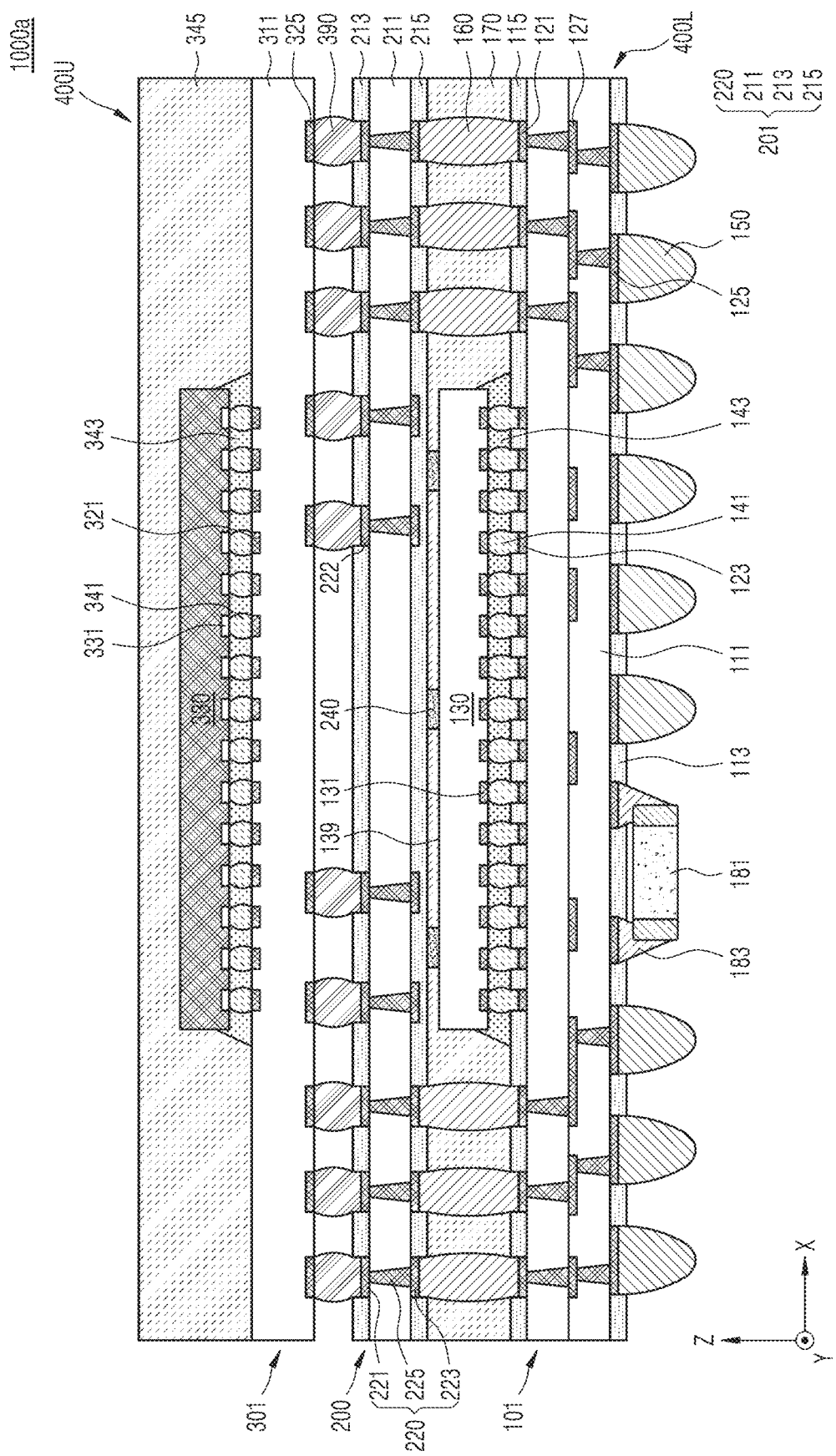
FIG. 8 is a cross-sectional view illustrating a semiconductor package according to some example embodiments of the inventive concepts.

FIG. 8 is a cross-sectional view illustrating a semiconductor package 1000a according to some example embodiments of the inventive concepts.

Referring to FIG. 8 together with FIGS. 1 and 2, the semiconductor package 1000a may include a lower package 400L and an upper package 400U. The semiconductor package 1000a may be a package-on-package type semiconductor package in which the upper package 400U is stacked on the lower package 400L.

In FIG. 8, the lower package 400L is illustrated to correspond to the semiconductor package 1000 described with reference to FIGS. 1 and 2. The lower package 400L may include any one of the interposers 200a and 200b, and may correspond to any one of the semiconductor packages described with reference to FIGS. 6 and 7.

The upper package 400U may include a second package substrate 301, a second semiconductor chip 330, and a molding layer 345.

The second package substrate 301 may be, for example, a printed circuit board. The second package substrate 301 may include a substrate base 311 made of at least one material selected from phenol resin, epoxy resin, and polyimide. Further, the second package substrate 301 may include an upper substrate pad 321 provided on an upper surface of the substrate base 311 and a lower substrate pad 325 provided on a lower surface of the substrate base 311. An internal wiring configured to electrically connect the upper substrate pad 321 to the lower substrate pad 325 may be formed in the substrate base 311.

The second package substrate 301 may be mounted on the interposer 200 through a plurality of second conductive connectors 390 arranged on the upper conductive pads 221 and the first upper conductive pads 222 of the interposer 200. Each of the plurality of second conductive connectors 390 may include a lower part connected to the upper conductive pads 221 or the first upper conductive pads 222, and an upper part connected to the lower substrate pads 325 of the second package substrate 301. Some of the plurality of second conductive connectors 390 may electrically connect the upper conductive pads 221 of the interposer 200 to the lower substrate pads 325 of the second package substrate 301, and some of the plurality of second conductive connectors 390 may electrically connect the first upper conductive pads 222 of the interposer 200 to the lower substrate pads 325 of the second package substrate 301.

The second semiconductor chip 330 may be provided on the second package substrate 301. For example, the chip pad 331 of the second semiconductor chip 330 may be electrically connected to the upper substrate pad 321 of the second package substrate 301 through the chip connection bump 341. An underfill material layer 343 surrounding the chip connection bump 341 may be formed between the second semiconductor chip 330 and the second package substrate 301.

In the example embodiments, the first semiconductor chip 130 and the second semiconductor chip 330 may be the same type of semiconductor chip. In the example embodiments, the first semiconductor chip 130 and the second semiconductor chip 330 may be different types of semiconductor chips. For example, the first semiconductor chip 130 may be a logic chip, and the second semiconductor chip 330 may be a memory chip. In the example embodiments, the second semiconductor chip 330 may be implemented as a high bandwidth memory (HBM) chip. In the example embodiments, the semiconductor package 1000a may be configured such that different types of semiconductor chips and components such as passive devices are electrically connected to each other to operate as a single system.

The molding layer 345 may be provided on the second package substrate 301 to cover at least a part of the second semiconductor chip 330. The molding layer 345 may include, for example, epoxy-based molding resin or polyimide-based molding resin. For example, the molding layer 345 may include an epoxy molding compound.

FIGS. 9A to 9D are cross-sectional views illustrating a method of manufacturing the semiconductor package, according to some example embodiments of the inventive concepts. Hereinafter, the method of manufacturing the semiconductor package 1000a illustrated in FIG. 8 will be described with reference to FIGS. 9A to 9D.

Figure 9A:
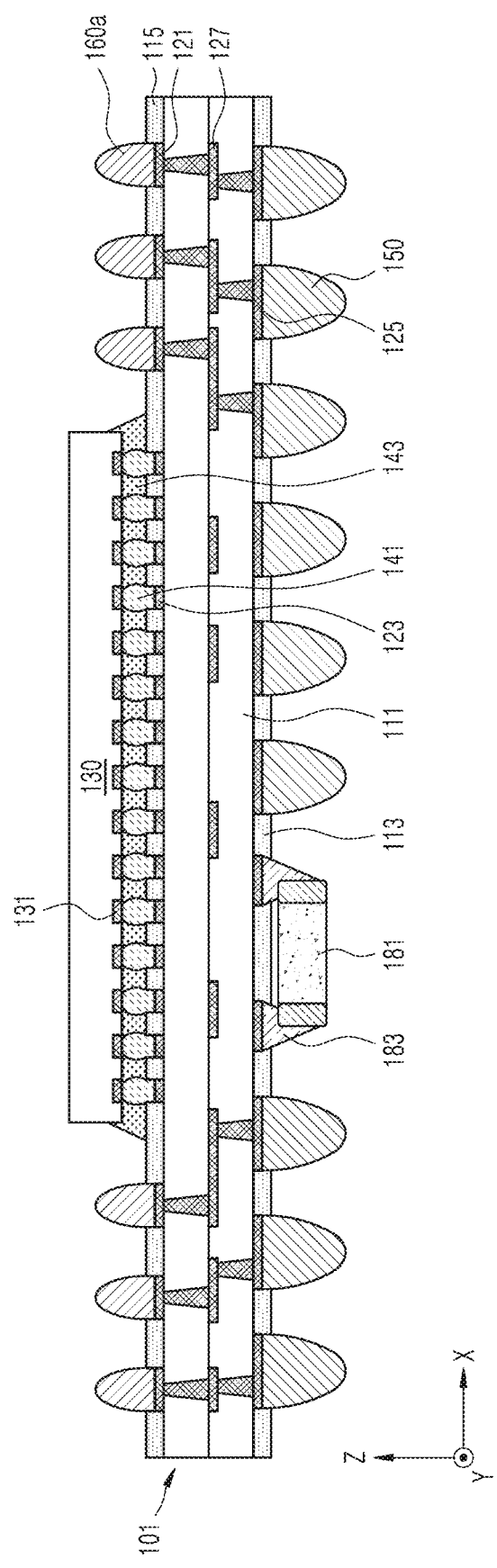
FIGS. 9A to 9D are cross-sectional views illustrating a method of manufacturing a semiconductor package according to some example embodiments of the inventive concepts.

Referring to FIG. 9A, the first semiconductor chip 130 is mounted on the first package substrate 101. The first semiconductor chip 130 may be mounted on the first package substrate 101 in a face-down method or a flip chip method. After mounting the first semiconductor chip 130 on the first package substrate 101, an underfilling process is performed to form the underfill material layer 143 surrounding the chip connection bumps 141 arranged between the first package substrate 101 and the first semiconductor chip 130. After the underfill material layer 143 is formed, a first sub-connector 160a is formed on the first upper substrate pad 121 of the first package substrate 101. The first sub-connector 160a may include, for example, solder or copper.

Figure 9B:
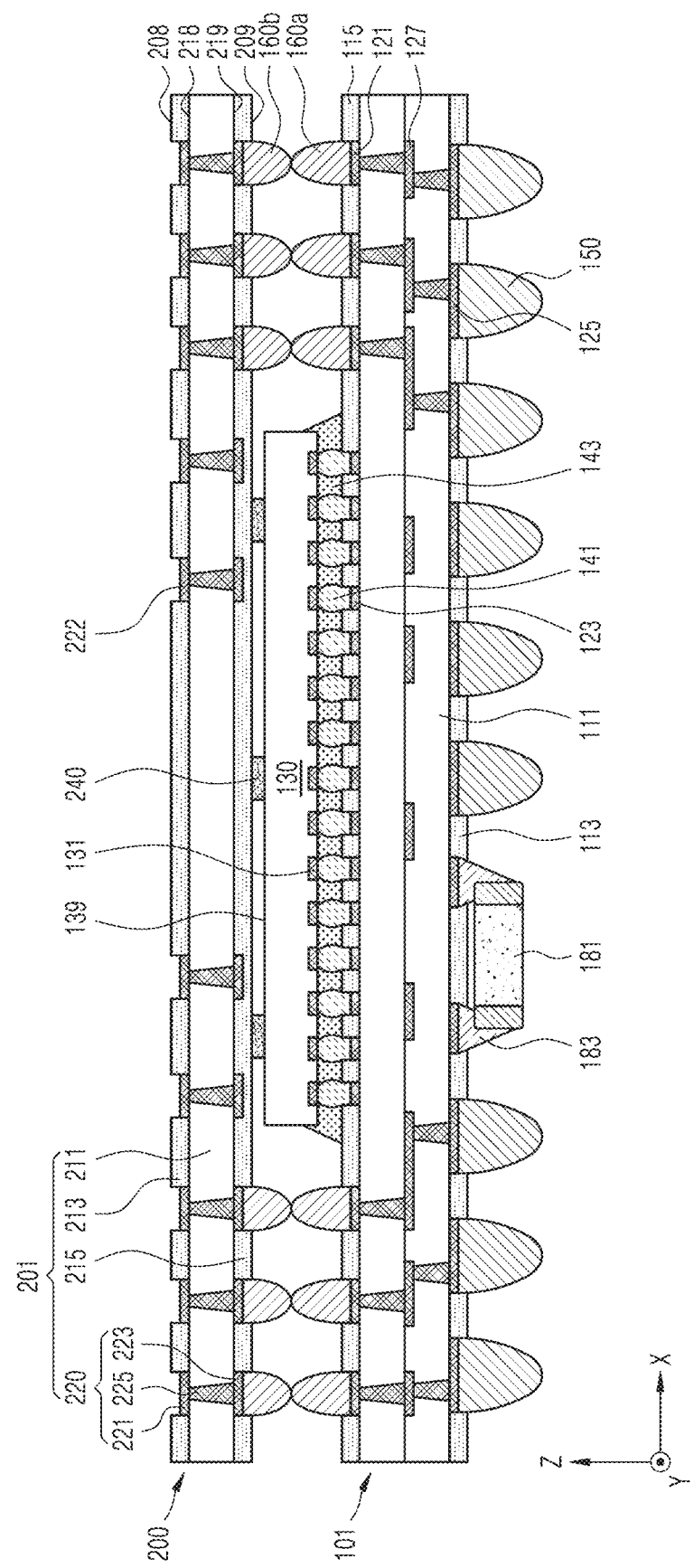

Referring to FIG. 9B, the interposer 200 to which a second sub-connector 160b is attached is prepared. The second sub-connector 160b may be attached to the lower conductive pad 223 of the interposer 200. For example, in order to attach the second sub-connector 160b to the lower conductive pad 223, a flux is applied on the lower conductive pad 223 and a conductor including solder, copper, or the like may be attached to the lower conductive pad 223 through a reflow process. Subsequently, the interposer 200, which is prepared, is positioned on the first semiconductor chip 130.

Figure 9C:
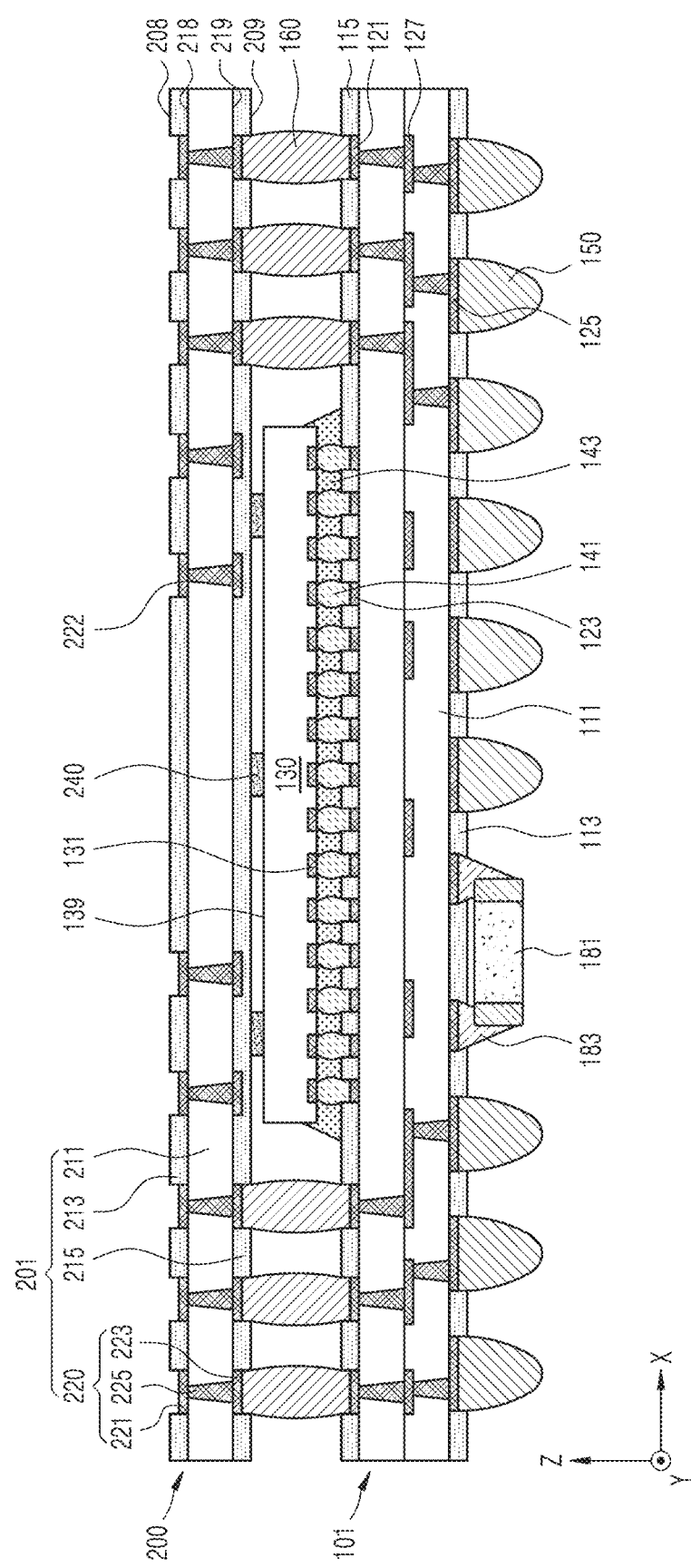

Referring to FIGS. 9B and 9C, the thermocompression bonding process is performed to couple the first sub-connector 160a to the second sub-connector 160b. The first sub-connector 160a is coupled with the second sub-connector 160b through the thermocompression bonding process to form the first conductive connector 160. Through the thermocompression bonding process, the interposer 200 may be mounted on the first package substrate 101, and the first semiconductor chip 130 may be between the first package substrate 101 and the interposer 200.

While the thermocompression bonding process is performed, the interposer 200 may be pressed downward by using a mold in an atmosphere at a temperature higher than room temperature. Because the plurality of spacers 240 are arranged on the lower surface 209 of the interposer substrate 201, the lower surface 209 of the interposer substrate 201 may be separated (or spaced apart) from the upper surface 139 of the first semiconductor chip 130 while the thermocompression bonding process is performed. While the interposer 200 is pressed downward, in each of the regions of the interposer substrate 201 overlapping each of the plurality of spacers 240 in the vertical direction (Z direction), the upper surface 208 of the interposer substrate 201 may be deformed to have the convex surface portion (see 208a in FIG. 3). Because the plurality of first upper conductive pads 222 are arranged so as not to overlap the plurality of spacers 240 in the vertical direction (Z direction), deformation of the plurality of first upper conductive pads 222 during the thermocompression bonding process may be mitigated or prevented.

After the interposer 200 is mounted on the first package substrate 101, a flux cleaning process for removing the flux remaining on the interposer substrate 201 may be performed. To perform the flux cleaning, a cleaning liquid may be supplied between the interposer substrate 201 and the first package substrate 101. While the flux cleaning is performed, in a case where the lower surface 209 of the interposer substrate 201 is not sufficiently separated from the upper surface 139 of the first semiconductor chip 130, the cleaning liquid may not be supplied between the interposer substrate 201 and the first semiconductor chip 130. Therefore, it may be difficult to clean the flux remaining between the interposer substrate 201 and the first semiconductor chip 130. However, in the example embodiments of the inventive concepts, because the plurality of spacers 240 are arranged substantially, evenly, and entirely over the lower surface 209 of the interposer substrate 201, the lower surface 209 of the interposer substrate 201 may be entirely separated from the upper surface 139 of the semiconductor chip 130. Therefore, while the flux cleaning is performed, the cleaning liquid is evenly supplied to the gap between the interposer substrate 201 and the first semiconductor chip 130, and thus the flux remaining between the interposer substrate 201 and the first semiconductor chip 130 may be effectively removed.

Figure 9D:
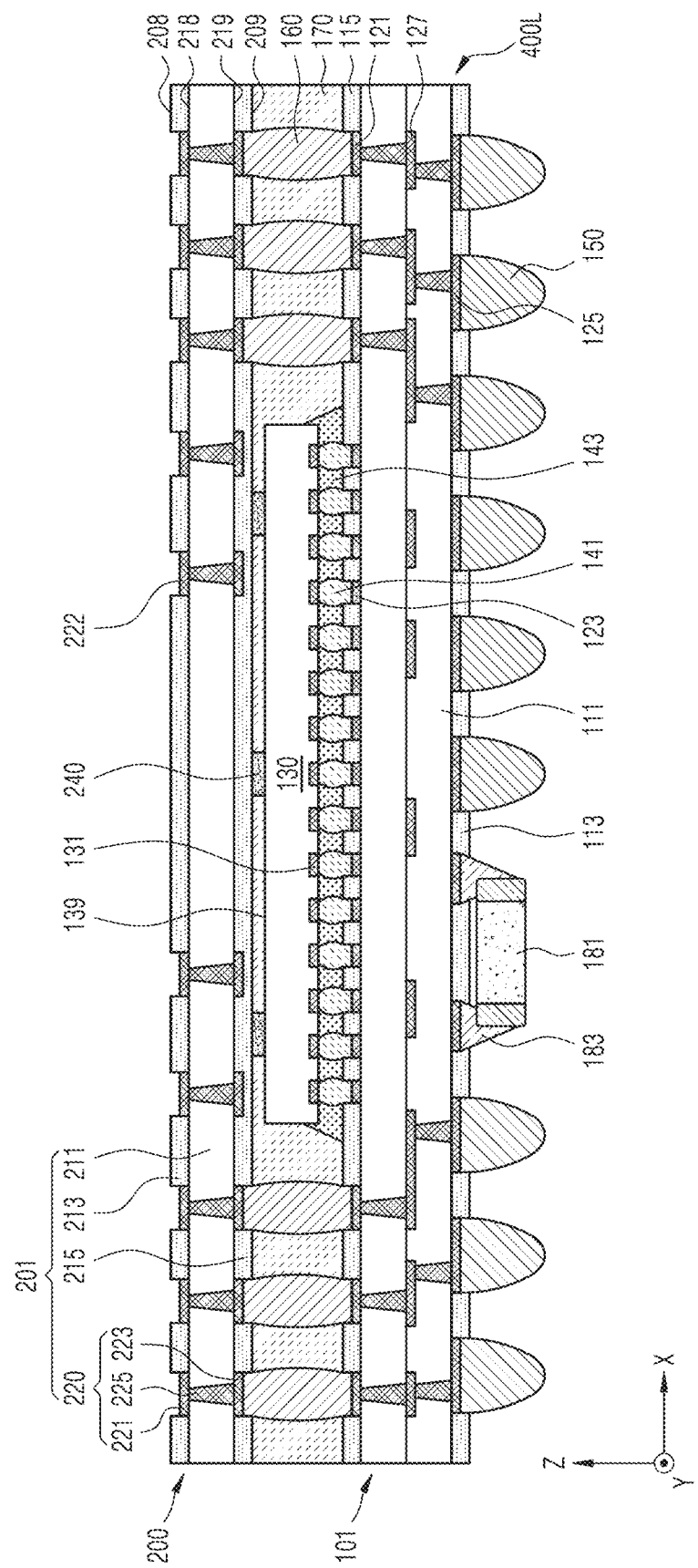

Referring to FIG. 9D, the insulating filler 170 may fill the portion between the first package substrate 101 and the interposer 200. For example, in order to form the insulating filler 170, the insulating filler material may be supplied between the first package substrate 101 and the interposer 200, and then the insulating filler material may be cured. In the example embodiments of the inventive concepts, because the lower surface 209 of the interposer substrate 201 is entirely separated from the upper surface 139 of the first semiconductor chip 130 by the plurality of spacers 240, the gap between the interposer substrate 201 and the first semiconductor chip 130 may be filled with the insulating filling material.

Next, referring to FIG. 8, the upper package 400U is mounted on the interposer 200. For example, by using the plurality of second conductive connectors 390 attached to the upper conductive pads 221 of the interposer substrate 201, the upper package 400U may be mounted on the interposer 200.

According to the example embodiments of the inventive concepts, the gap is provided between the interposer substrate 201 and the first semiconductor chip 130 by using the plurality of spacers 240 to solve the problem of incomplete filling of the insulating filler 170. Thus, reliability of the connection between the first upper conductive pad 222 and the second conductive connector 390 may be mitigated or prevented from deteriorating by positioning the plurality of first upper conductive pads 222 so as not to overlap the plurality of spacers 240 in the vertical direction (Z direction).

While the inventive concepts have been particularly shown and described with reference to some example embodiments thereof, it will be understood that various changes in form and details may be made therein without departing from the spirit and scope of the following claims.

What is claimed is:

1. A semiconductor package comprising:
a first package substrate;
a first semiconductor chip on the first package substrate;
a first conductive connector on the first package substrate and laterally spaced apart from the first semiconductor chip;
an interposer substrate on the first semiconductor chip and electrically connected to the first package substrate through the first conductive connector, the interposer substrate including a first portion overlapping the first semiconductor chip and a plurality of upper conductive pads in the first portion;
a plurality of spacers on a lower surface of the first portion of the interposer substrate that faces the first semiconductor chip and positioned so as not to overlap the plurality of upper conductive pads in a plan view, the plurality of spacers being in contact with both the interposer substrate and the first semiconductor chip;
an insulating filler between the interposer substrate and the first package substrate, the insulating filler being in contact with the first conductive connector and the first semiconductor chip;
a plurality of second conductive connectors on the plurality of upper conductive pads;
a second package substrate on the plurality of second conductive connectors; and
a second semiconductor chip on the second package substrate.

2. The semiconductor package of claim 1, wherein the plurality of spacers include at least five spacers.

3. The semiconductor package of claim 2, wherein the at least five spacers include:
a center spacer at a center of the lower surface of the first portion of the interposer substrate, and
four edge spacers symmetrically positioned with respect to the center of the lower surface of the first portion of the interposer substrate.

4. The semiconductor package of claim 3, wherein a diameter of the center spacer is greater than diameters of the four edge spacers.

5. The semiconductor package of claim 1, wherein
the plurality of upper conductive pads include four upper conductive pads, which are arranged to correspond to four vertexes of a rectangle, in a plan view, and
at least one of the plurality of spacers is positioned in a middle of the four upper conductive pads in a plan view.

6. The semiconductor package of claim 5, wherein the at least one of the plurality of spacers positioned in the middle of the four upper conductive pads has a diameter less than a distance between two upper conductive pads that are adjacent to each other in a diagonal direction among the four upper conductive pads.

7. The semiconductor package of claim 1, wherein a region overlapping the plurality of spacers on an upper surface of the first portion of the interposer substrate includes a convex surface portion.

8. The semiconductor package of claim 1, wherein the lower surface of the first portion of the interposer substrate includes a recessed surface portion that is recessed from a periphery thereof, the recessed surface portion contacting one of the plurality of spacers.

9. The semiconductor package of claim 1, wherein the interposer substrate includes:
a base insulating layer;
an upper protective insulating layer on an upper surface of the base insulating layer and covering a part of each of the plurality of upper conductive pads;
a lower conductive pad on a lower surface of the base insulating layer and connected to the first conductive connector; and
a lower protective insulating layer on the lower surface of the base insulating layer and covering a part of the lower conductive pad.

10. The semiconductor package of claim 9, wherein the plurality of spacers are on the lower protective insulating layer and include a same material as that of the lower protective insulating layer.

11. The semiconductor package of claim 10, wherein the plurality of spacers and the lower protective insulating layer include a solder resist.

12. The semiconductor package of claim 9, wherein the plurality of spacers are on the lower protective insulating layer and include a material different from that of the lower protective insulating layer.

13. The semiconductor package of claim 1, wherein the first semiconductor chip includes a plurality of grooves accommodating the plurality of spacers.

14. A semiconductor package comprising:
a package substrate;
a semiconductor chip on the package substrate;
a first conductive connector on the package substrate and laterally spaced apart from the semiconductor chip;
an interposer substrate on the semiconductor chip, the interposer substrate including a first portion overlapping the semiconductor chip in a first direction perpendicular to an upper surface of the package substrate, a second portion connected to the first conductive connector, and a plurality of upper conductive pads at an upper surface of the first portion; and a plurality of spacers between a lower surface of the first portion of the interposer substrate and the semiconductor chip, and positioned so as not to overlap the plurality of upper conductive pads in a plan view, the plurality of spacers being in contact with both the interposer substrate and the semiconductor chip.

15. The semiconductor package of claim 14, wherein the plurality of spacers include:

a center spacer positioned in a center of the lower surface of the first portion of the interposer substrate; and a plurality of edge spacers on an outer portion of the lower surface of the first portion of the interposer substrate to be symmetric with respect to the center of the lower surface of the first portion of the interposer substrate.

16. The semiconductor package of claim 14, wherein the plurality of upper conductive pads include four upper conductive pads, which are arranged to correspond to four vertexes of a rectangle, in a plan view, and at least one of the plurality of spacers is positioned in a middle of the four upper conductive pads in a plan view, and has a diameter less than a distance between two upper conductive pads that are adjacent to each other in a diagonal direction among the four upper conductive pads.

17. The semiconductor package of claim 16, wherein the upper surface of the first portion of the interposer substrate includes a surface portion protruding convexly between the four upper conductive pads.

18. The semiconductor package of claim 14, wherein the interposer substrate includes:

a base insulating layer;

an upper protective insulating layer covering a part of each of the plurality of upper conductive pads and an upper surface of the base insulating layer;

a lower conductive pad on the lower surface of the base insulating layer and connected to the first conductive connector; and a lower protective insulating layer covering a part of the lower conductive pad and the lower surface of the base insulating layer, and including a same material as that of the plurality of spacers.

19. The semiconductor package of claim 14, wherein the plurality of spacers protrude toward the semiconductor chip from the lower surface of the first portion of the interposer substrate, and the semiconductor chip includes a plurality of grooves into which the plurality of spacers are inserted.

20. An interposer for a semiconductor package, the interposer comprising:

a base insulating layer;

a plurality of upper conductive pads on an upper surface of the base insulating layer;

an upper protective insulating layer covering the upper surface of the base insulating layer and including openings exposing the plurality of upper conductive pads;

a plurality of lower conductive pads on a lower surface of the base insulating layer;

a lower protective insulating layer covering the lower surface of the base insulating layer and including openings exposing the plurality of lower conductive pads; and a plurality of spacers on the lower protective insulating layer and positioned so as not to overlap the plurality of upper conductive pads in a plan view, the plurality of spacers being in contact with the lower protective insulating layer, wherein the plurality of upper conductive pads include four upper conductive pads arranged in a rectangular shape on the upper surface of the base insulating layer, and at least one of the plurality of spacers is between the four upper conductive pads, which are arranged to correspond to four vertexes of a rectangle, respectively, in a plan view.

* * * * *